(12) United States Patent
Matsushita et al.

(10) Patent No.: US 11,482,476 B2
(45) Date of Patent: Oct. 25, 2022

(54) POWER SEMICONDUCTOR DEVICE WITH AN ELEMENT INSTALLATION CONDUCTOR

(71) Applicant: Hitachi Automotive Systems, Ltd., Hitachinaka (JP)

(72) Inventors: Akira Matsushita, Hitachinaka (JP); Takahiro Shimura, Hitachinaka (JP); Yusuke Takagi, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 0 days.

(21) Appl. No.: 17/273,620

(22) PCT Filed: Jul. 26, 2019

(86) PCT No.: PCT/JP2019/029368
§ 371 (c)(1),
(2) Date: Mar. 4, 2021

(87) PCT Pub. No.: WO2020/049891
PCT Pub. Date: Mar. 12, 2020

(65) Prior Publication Data
US 2021/0366812 A1 Nov. 25, 2021

(30) Foreign Application Priority Data
Sep. 5, 2018 (JP) .............................. JP2018-165620

(51) Int. Cl.
*H01L 23/495* (2006.01)
*H01L 23/31* (2006.01)
(52) U.S. Cl.
CPC .... *H01L 23/49555* (2013.01); *H01L 23/3107* (2013.01)
(58) Field of Classification Search
CPC ........... H01L 23/49555; H01L 23/3107; H01L 25/072; H01L 23/49541; H01L 23/49562;
(Continued)

(56) References Cited

U.S. PATENT DOCUMENTS

2011/0310585 A1 12/2011 Suwa et al.
2013/0235636 A1 9/2013 Kadoguchi et al.
(Continued)

FOREIGN PATENT DOCUMENTS

JP 58-34748 U 3/1983
JP 7-211839 A 8/1995
(Continued)

OTHER PUBLICATIONS

International Search Report (PCT/ISA/210) issued in PCT Application No. PCT/JP2019/029368 dated Nov. 19, 2019 with English translation (four (4) pages).
(Continued)

*Primary Examiner* — Caleb E Henry
*Assistant Examiner* — Dilinh P Nguyen
(74) *Attorney, Agent, or Firm* — Crowell & Moring LLP

(57) ABSTRACT

An object of the present invention is to provide a power semiconductor device capable of improving seismic resistance while suppressing a decrease in assembly efficiency. According to the present invention, a power semiconductor device 1 includes an element installation conductor 2 including a first conductor portion 20a that is made of metal and is used for installing a power semiconductor element 300, a second conductor portion 20b that is made of metal and forms one or more main terminals 2a for transmitting a current to the power semiconductor element 300, and one or more control terminals 2b for transmitting a switching control signal to the power semiconductor element 300, and a third conductor portion 20c that is made of metal and is provided at a tip portion of the control terminal 2b. In the power semiconductor device 1, the element installation conductor 2 is formed so that the thickness of the thickest portion of the second conductor portion 20b is thinner than the thickness of the first conductor portion 20a, and the
(Continued)

thickness of the thickest portion of the third conductor portion 20c is thinner than the thickness of the thinnest portion of the second conductor portion 20b.

7 Claims, 6 Drawing Sheets

(58) Field of Classification Search
CPC ..... H01L 23/49548; H01L 2224/32245; H01L 2224/33181; H01L 2224/8384
USPC .......................................................... 257/670
See application file for complete search history.

(56) References Cited

U.S. PATENT DOCUMENTS

| | | |
|---|---|---|
| 2016/0007492 A1 | 1/2016 | Suwa et al. |
| 2017/0018484 A1 | 1/2017 | Kadoguchi et al. |
| 2017/0309556 A1 | 10/2017 | Shimakawa et al. |
| 2018/0278172 A1* | 9/2018 | Tokuyama .......... H01L 23/3675 |
| 2018/0303001 A1 | 10/2018 | Suwa et al. |
| 2020/0068735 A1 | 2/2020 | Suwa et al. |

FOREIGN PATENT DOCUMENTS

| | | |
|---|---|---|
| JP | 2012-5322 A | 1/2012 |
| JP | 2014-45157 A | 3/2014 |
| JP | 2018-73892 A | 5/2018 |
| WO | WO 2012-073306 A1 | 6/2012 |
| WO | WO 2015/136968 A1 | 9/2015 |
| WO | WO 2016/080521 A | 5/2016 |
| WO | WO 2017/056686 A1 | 4/2017 |

OTHER PUBLICATIONS

Japanese-language Written Opinion (PCT/ISA/237) issued in PCT Application No. PCT/JP2019/029368 dated Nov. 19, 2019 (four (4) pages).

* cited by examiner

POWER SEMICONDUCTOR DEVICE WITH AN ELEMENT INSTALLATION CONDUCTOR

TECHNICAL FIELD

The present invention relates to a power semiconductor device.

BACKGROUND ART

As a conventional technology relating to a power semiconductor device, for example, PTL 1 discloses a power module as follows. The power module includes a semiconductor element, a base portion made of a conductive material, a signal lead portion, and a thin plate lead portion. The semiconductor element is placed on the base portion. The signal lead portion is made of the same material as the material of the base portion and is electrically connected to the semiconductor element. The thin plate lead portion is made of the same material as the material of the base portion and is formed to be continuous from the base portion. The plate thickness of the thin plate lead portion is thinner than the base portion. The thin plate lead portion extends toward the same side as the signal lead portion side with respect to the base portion. The thin plate lead portion forms a potential detection terminal that is electrically connected to a predetermined terminal of the semiconductor element through the base portion so as to detect the potential at the predetermined terminal of the semiconductor element.

CITATION LIST

Patent Literature

PTL 1: International Publication No. 2012/073306

SUMMARY OF INVENTION

Technical Problem

Meanwhile, the power semiconductor device is expected to be used in a vibrating environment. Thus, a structure of, for example, securing seismic resistance of a terminal for connecting the power semiconductor device to the outside is required. In the above-described conventional technology, improvement of the seismic resistance is achieved by improving the rigidity of the terminal in a manner that the terminal is fixed and reinforced by resin molding or potting, or the terminal is connected to an individual component by TIG (Tungsten Inert Gas) welding or the like.

However, when the terminal is reinforced by resin molding or potting, a process such as automatic visual inspection, which is performed for ensuring the accuracy of the reinforcement is required, and thus the man-hours for assembling the power semiconductor device increase. In addition, when the terminal is reinforced by welding or the like, a welding process is naturally required, and thus the man-hours increase. That is, in the conventional technology, there is a concern that the efficiency may be deteriorated by the increase in the number of processes related to the assembly of the power semiconductor device.

The present invention has been made in view of the above circumferences, and an object of the present invention is to provide a power semiconductor device capable of improving seismic resistance while suppressing a decrease in assembly efficiency.

Solution to Problem

The present application includes plural pieces of means for solving the above problems. For example, a power semiconductor device includes a power semiconductor element, and an element installation conductor including a first conductor portion that is made of metal and is used for installing the power semiconductor element, a second conductor portion that is made of metal and forms one or more main terminals for transmitting a current to the power semiconductor element, and one or more control terminals for transmitting a switching control signal to the power semiconductor element, and a third conductor portion that is made of metal and is provided at a tip portion of the control terminal. The element installation conductor is formed so that a thickness of a thickest portion of the second conductor portion is thinner than a thickness of the first conductor portion, and a thickness of a thickest portion of the third conductor portion is thinner than a thickness of a thinnest portion of the second conductor portion.

Advantageous Effects of Invention

According to the present invention, it is possible to provide a power semiconductor device capable of improving seismic resistance while suppressing a decrease in assembly efficiency.

DESCRIPTION OF EMBODIMENTS

Hereinafter, an embodiment of the present invention will be described with reference to the drawings.

First Embodiment

A first embodiment of the present invention will be described with reference to FIGS. 1 to 4.

Figure 1:
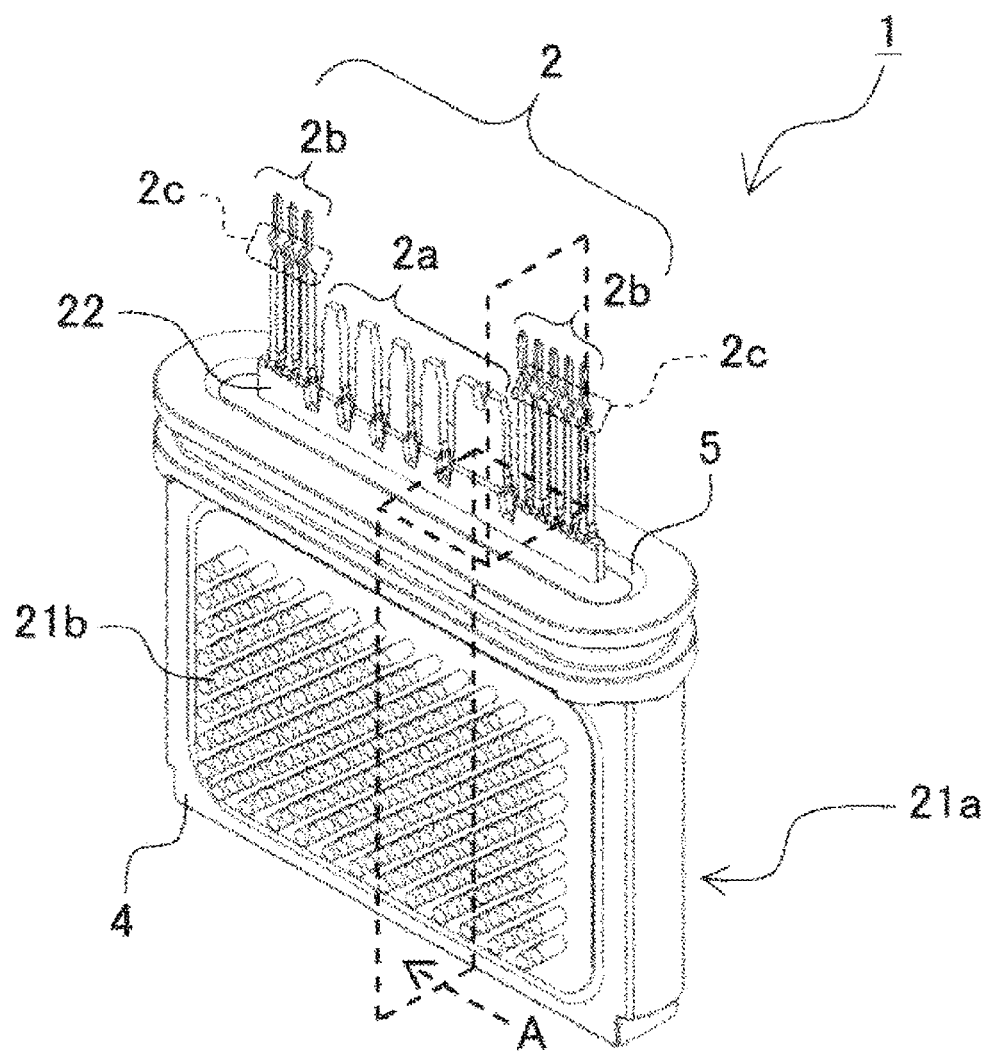
FIG. 1 is a diagram schematically illustrating an appearance of a power semiconductor device according to a first embodiment.
Figure 2:
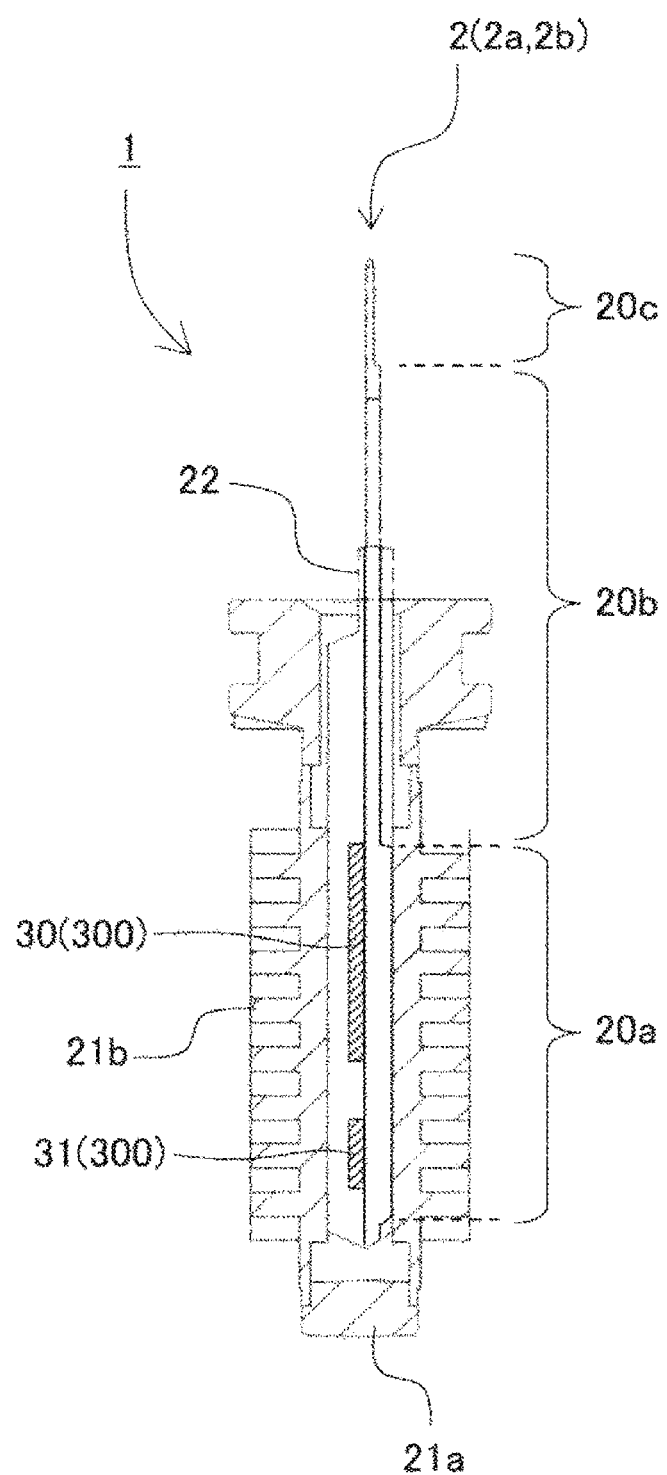
FIG. 2 is a cross-sectional view taken along line A in FIG. 1.
Figure 3:
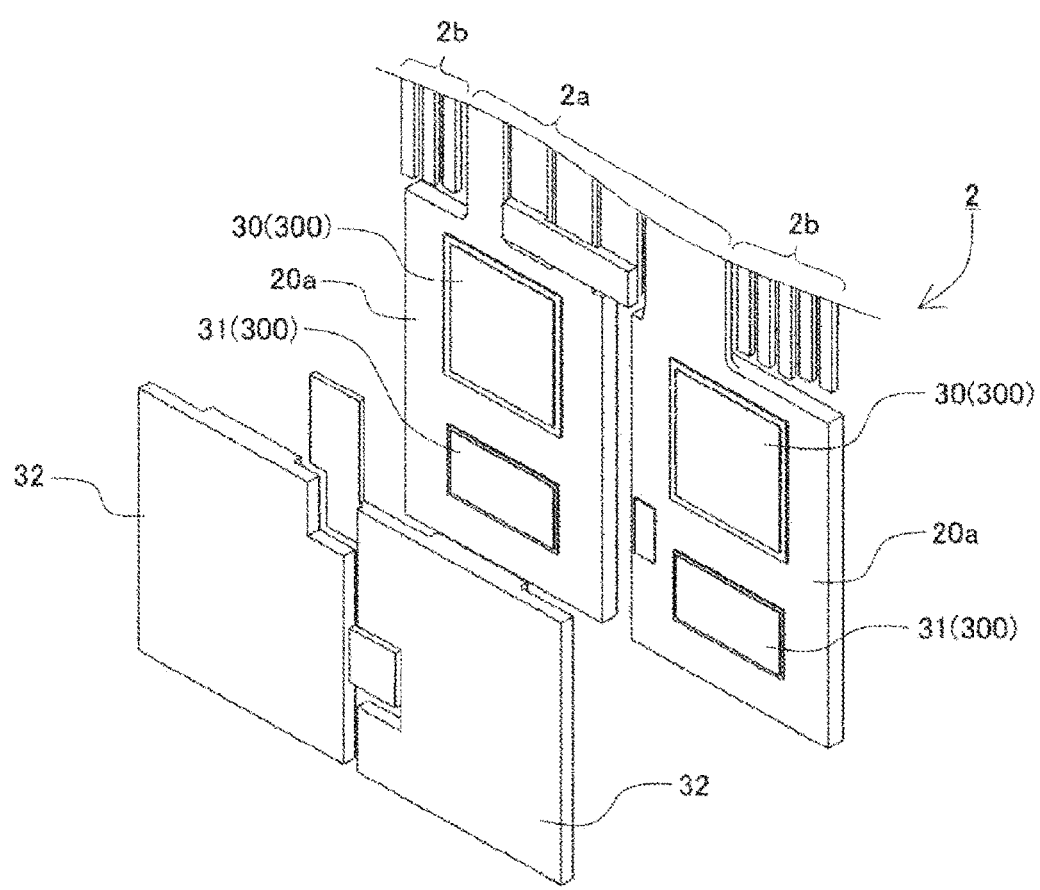
FIG. 3 is a diagram illustrating an extracted element installation conductor.

FIG. 1 is a diagram schematically illustrating the appearance of a power semiconductor device according to the present embodiment. FIG. 2 is a cross-sectional view taken along line A in FIG. 1. In addition, FIG. 3 is a diagram illustrating an element installation conductor extracted from FIGS. 1 and 2. Note that, in FIG. 3, the tip portions of the main terminal and the control terminal are not illustrated for simple illustration.

In FIGS. 1 to 3, a power semiconductor device 1 includes at least one power semiconductor element 300 (represented by the reference sign 300 below) including an IGBT (Insulated Gate Bipolar Transistor) 30, a diode 31, and the like, and an element installation conductor 2 including a first conductor portion 20a, a second conductor portion 20b, and a third conductor portion 20c. The first conductor portion 20a is made of metal and is used for installing the power semiconductor element 300. The second conductor portion 20b is made of metal and forms one or more main terminals 20a for transmitting a current to the power semiconductor element 300 and one or more control terminals 2b for transmitting a switching control signal to the power semiconductor element 300. The third conductor portion 20c is made of metal and is provided at the tip portion of the control terminal.

The element installation conductor 2 refers to a lead frame or bus bar component made of copper (Cu) or a copper alloy. The element installation conductor 2 is formed so that the thickness of the thickest portion of the second conductor portion 20b is thinner than the thickness of the first conductor portion 20a, and the thickness of the thickest portion of the third conductor portion 20c is thinner than the thickness of the thinnest portion of the second conductor portion 20b. That is, the element installation conductor 2 is formed to gradually become thinner from the first conductor portion 20a to the tips of the main terminal 2a and the control terminal 2b.

Note that, in the present embodiment, an example in which, regarding the three portions being the first conductor portion 20a, the second conductor portion 20b, and the third conductor portion 20c, the thickness becomes thinner in three stages from the first conductor portion 20a toward the third conductor portion 20c will be described. The embodiment is not limited thereto, and the three portions may be configured so that the thickness becomes thinner toward the tips in three or more stages. That is, for example, the second conductor portion 20b may be formed with two types of thicknesses that become thinner toward the tip so as to be thinner than the first conductor portion 20a and be thicker than the third conductor portion 20c.

Further, in the power semiconductor device 1, the entirety of the first conductor portion 20a and a portion of the second conductor portion 20b are covered by a housing 4 including a frame body 21a and a heat dissipation fin group 21b. The entirety of the first conductor portion 20a and the portion of the second conductor portion 20b are transfer-molded and sealed in the housing 4 together with the power semiconductor element 300 and the like by a sealing resin 22 containing epoxy resin, for example.

The housing 4 is made of a material having excellent thermal conductivity, and is preferably made of, for example, aluminum or an aluminum alloy. Further, the frame body 21a is made of a material having higher rigidity than the heat dissipation fin group 21b. Note that, although FIG. 1 illustrates only one main surface of the housing 4 for convenience of illustration, the heat dissipation fin group 21b is configured on both main surfaces of the housing 4 to realize a double-sided cooling structure. Heat dissipation fins constituting the heat dissipation fin group 21b are formed in a columnar shape, for example, and are regularly arranged.

The power semiconductor element 300 including the IGBT 30, the diode 31, and the like is mounted on the first conductor portion 20a of the element installation conductor 2 with solder, a sintered member, or the like. The first conductor portion 20a serves as a conduction path for the main current and as a heat dissipation path for dissipating heat of the power semiconductor element 300 to the outside of the power semiconductor device 1.

The power semiconductor element 300 is disposed to be sandwiched by the first conductor portion 20a and a conductor plate 32. The conductor plate 32 serves as the heat dissipation path of the power semiconductor element 300. In addition, for example, an emitter electrode of the IGBT 30 and an anode electrode of the diode 31 are fixed to the conductor plate 32. Note that, a portion or the entirety of the first conductor portion 20a may be subjected to surface treatment (roughening treatment) to improve the adhesion with the sealing resin 22.

The main terminal 2a of the element installation conductor 2 is an energization path of the main current between the outside of the power semiconductor device 1 and the power semiconductor element 300. The main terminals 2a are include a DC positive electrode terminal, a DC negative electrode terminal, an AC terminal, and the like. The main terminal 2a is formed by the second conductor portion 20b formed to be thinner than the first conductor portion 20a. Note that a portion or the entirety of the second conductor portion 20b of the main terminal 2a is subjected to surface treatment (roughening treatment) to improve the adhesion with the sealing resin 22.

The control terminal 2b of the element installation conductor 2 is a signal path for inputting and outputting a signal for controlling the power semiconductor element. The control terminal 2b is formed by the second conductor portion 20b formed to be thinner than the first conductor portion 20a and the third conductor portion 20c formed to be thinner than the second conductor portion 20b. The tip of the control terminal 2b is connected to a control board (not illustrated) by solder connection, connector connection, or the like Note that, the tip (third conductor portion 20c) of the control terminal 2b is subjected to surface treatment such as tin (Sn) plating or gold (Au) plating, in accordance with the connection structure with the control board.

Further, each terminal of the control terminal 2b is provided with a bend portion (first bent portion) 2c formed so that a portion of the third conductor portion 20c deviates from an extension direction. Thus, with the change of the elasticity of the bend portion 2c, it is possible to relive the stress caused by vibration and thermal deformation. Note that the control terminals 2b include a terminal for outputting a signal indicating the element temperature. Further, the curvature R of the bend portion (first bent portion) 2c is preferably equal to or larger than the plate thickness of a portion at which the bend portion 2c is provided. In addition, in the present embodiment, a case where the bend portion (first bent portion) 2c is provided in the third conductor portion 20c is described as an example. The embodiment is not limited to this, and for example, a configuration in which the bend portion is provided in the second conductor portion may be made.

Here, an example for the thickness of the first conductor portion 20a to the third conductor portion 20c will be described. The first conductor portion 20a is formed to have a thickness of, for example, 2.0 mm in consideration of the heat capacity and thermal resistance required for dissipating the heat generated by the power semiconductor element 300. The second conductor portion 20b of the main terminal 2a is formed to have a thickness of, for example, 1.5 mm to 2.0 mm (less than 2.0 mm) as thick as the cross-sectional area required for energization can be secured. The third conductor portion 20c of the control terminal 2b is formed to be thinner than the second conductor portion 20b and to have a thickness of, for example, 0.64 mm, which is common as the control terminal. Since the lateral dimension (that is, width) of the control terminal 2b is generally formed to be 0.64 mm, the third conductor portion 20c of the control terminal 2b is formed to have a square shape in which one side of the cross section is 0.64 mm.

The main terminal 2a and the control terminal 2b are formed to protrude from the sealing resin 22 in the same direction. The side surface of the second conductor portion 20b of the main terminal 2a is formed to face the side surface of the second conductor portion 20b of the control terminal 2b. Further, the main terminal 2a is formed by the second conductor portion 20b and does not have the third conductor portion 20c. Then, the main terminal 2a and the control terminal 2b are formed so that only the side surfaces of the second conductor portions 20b of the main terminal 2a and the control terminal 2b face each other, and the side surface of the second conductor portion 20b of the main terminal 2a does not face the side surface of the third conductor portion 20c of the control terminal 2b. That is, the control terminal 2b is formed to be longer than the main terminal 2a by the length of the third conductor portion 20c. Thus, it is possible to set the length of the control terminal 2b to be longer than the length of the main terminal 2a. Thus, it is possible to prevent an occurrence of the interference between the main terminal 2a and the control board, the insufficient insulation distance, or the like when the control terminal 2b is connected to the control board.

Figure 4:
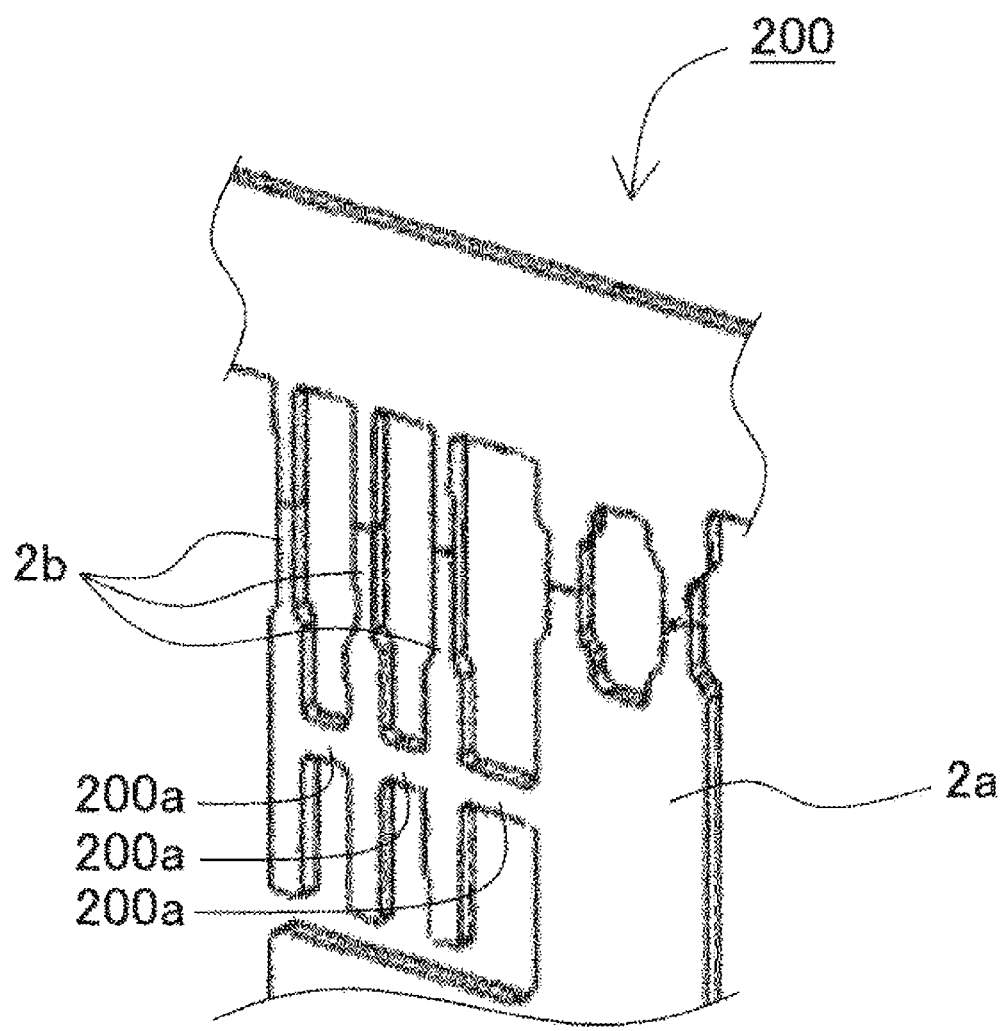
FIG. 4 is a diagram illustrating a form in which a main terminal and a control terminal are connected to each other by a tie bar.

FIG. 4 is a diagram illustrating a form in which the main terminal and the control terminal are connected to each other by a tie bar. Further, FIG. 5 is an enlarged view illustrating a form between the terminals in FIG. 1.

Figure 5:
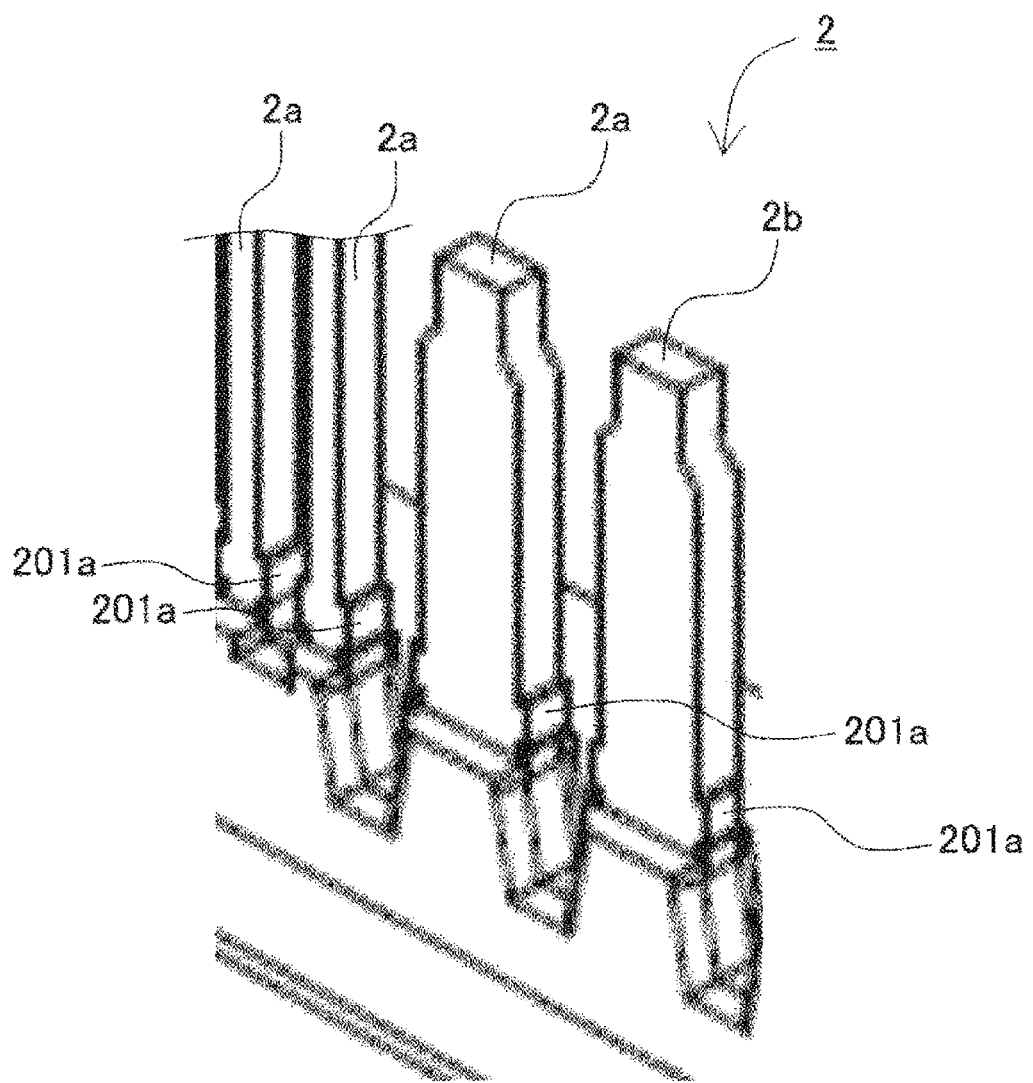
FIG. 5 is an enlarged view illustrating a form between terminals in FIG. 1.

As illustrated in FIG. 5, a cut surface 201a of a tie bar 200a is formed at the opposite portion of the side surface of the second conductor portion 20b of the main terminal 2a, the opposite portion of the side surface of the second conductor portion 20b of the control terminal 2b, or at the opposite portions of the side surface of the second conductor portion 20b of the main terminal 2a and the side surface of the second conductor portion 20b of the control terminal 2b.

As illustrated in FIG. 4, the tie bar 200a fixes the relative positions of the main terminal 2a and the control terminal 2b on the element installation conductor 2 before being transfer-molded and sealed by the sealing resin 22. The tie bar 200a also prevents the sealing resin 22 from flowing out from spaces between the terminals of the main terminal 2a and between the terminals of the control terminal 2b. In the element installation conductor 2 after the relative positions of the main terminal 2a and the control terminal 2b are fixed by the sealing resin 22, the tie bar 200a is cut out and removed so that the terminals of the main terminal 2a and the terminals of the control terminal 2b are electrically isolated from each other.

That is, it is conceivable that the second conductor portion 20b of the main terminal 2a and the second conductor portion 20b of the control terminal 2b are integrally formed through the tie bar. Thus, considering the convenience in the integral formation, the thickness of the second conductor portion 20b of the main terminal 2a is preferably equal to the thickness of the second conductor portion 20b of the control terminal 2b. Note that, the cut surface may have either a convex shape or a concave shape with respect to the side surface of each terminal, but the convex shape is preferable from the viewpoint of securing the terminal strength.

The effects of the present embodiment configured as described above will be described.

Since the power semiconductor device is expected to be used in a vibrating environment, a structure of, for example, securing seismic resistance of the terminal for connecting the power semiconductor device to the outside is required.

In the conventional technology, improvement of the seismic resistance is achieved by improving the rigidity of the terminal in a manner that the terminal is fixed and reinforced by resin molding or potting, or the terminal is connected to an individual component by TIG (Tungsten Inert Gas) welding or the like. However, when the terminal is reinforced by resin molding or potting, a process such as automatic visual inspection, which is performed for ensuring the accuracy of the reinforcement is required, and thus the man-hours for assembling the power semiconductor device increase. In addition, when the terminal is reinforced by welding or the like, a welding process is naturally required, and thus the man-hours increase. That is, in the conventional technology, there is a concern that the efficiency may be deteriorated by the increase in the number of processes related to the assembly of the power semiconductor device.

On the other hand, in the present embodiment, the power semiconductor device includes the power semiconductor element 300 and the element installation conductor 2 including the first conductor portion 20a that is made of metal and is used for installing the power semiconductor element 300, the second conductor portion 20b that is made of metal and forms one or more main terminals 2a for transmitting a current to the power semiconductor element 300, and one or more control terminals 2b for transmitting a switching control signal to the power semiconductor element 300, and the third conductor portion 20c that is made of metal and is provided at the tip portion of the control terminal 2b. In the power semiconductor device 1, the element installation conductor 2 is formed so that the thickness of the thickest portion of the second conductor portion 20b is thinner than the thickness of the first conductor portion 20a, and the thickness of the thickest portion of the third conductor portion 20c is thinner than the thickness of the thinnest portion of the second conductor portion 20b.

Thus, it is possible to improve the strength (rigidity) of each terminal and to improve the seismic resistance while suppressing a decrease in assembly efficiency. That is, it is possible to improve the reliability and the lifespan of the power semiconductor device as a product.

In addition, since the thickness of the second conductor portion 20b is thinner than the thickness of the first conductor portion 20a, and the thickness of the third conductor portion 20c is thinner than the thickness of the second conductor portion 20b, it is possible to integrate the entirety of the element installation conductor 2 configured by the first conductor portion 20a to the third conductor portion 20c, with a copper (Cu) material (for example, roll material). Therefore, it is possible to reduce the number of components and to eliminate the integration of caulking in another process.

In addition, it is assumed that the third conductor portion 20c has the first bent portion formed to deviate from the extension direction of the third conductor portion 20c.

Thus, it is possible to buffer the deformation and stress due to the vibration and heat. Accordingly, it is possible to relieve the stress on a connection portion by solder bonding, connector connection, or press-fit connection between the tip of the control terminal 2b and the control board, and to suppress the damage of the terminal or the breakage of a bonded portion.

Further, it is assumed that the main terminal 2a is formed by the second conductor portion 20b, the control terminal 2b is formed by the second conductor portion 20b and the third conductor portion 20c, and the side surface of the second conductor portion 20b of the main terminal 2a faces the side surface of the second conductor portion 20b of the control terminal 2b.

Thus, the control terminal 2b is formed to be longer than the main terminal 2a by the length of the third conductor portion 20c. Thus, it is possible to prevent an occurrence of the interference between the main terminal 2a and the control board, the insufficient insulation distance, or the like when the control terminal 2b is connected to the control board.

Further, it is assumed that the sealing resin 22 for sealing the entirety of the first conductor portion 20a and the portion of the second conductor portion 20b is provided, and the main terminal 2a and the control terminal 2b are formed to protrude from the sealing resin 22 in the same direction.

Thus, it is possible to align a terminal protruding direction in the same direction, and thus it is possible to realize the size reduction of the power semiconductor device 1 in comparison to a case where the terminals protrude in a plurality of directions. In addition, by aligning the terminal protruding direction in the same direction, it is possible to set a connection direction when the power semiconductor device 1 is connected to the control board of an inverter device or the like, in one direction. Accordingly, it is possible to more facilitate a work than connections in a plurality of directions. Further, in a water cooling method, it is possible to set one sealing point, simplify the sealing structure, and reduce the number of sealing members.

Further, it is assumed that the cut surface 201a of the tie bar 200a for fixing the relative positions of the main terminal 2a and the control terminal 2b is formed at the opposite portions of the side surfaces of the second conductor portion 20b of the main terminal 2a and the control terminal 2b.

Thus, it is possible to improve the strength (rigidity) of each terminal and to improve the seismic resistance while suppressing a decrease in assembly efficiency. That is, it is possible to improve the reliability and the lifespan of the power semiconductor device as a product.

Modified Example of First Embodiment

A modification example of the first embodiment in the present invention will be described with reference to FIG. 6. In the present modification example, only the differences from the first embodiment will be described, and members similar to those in the first embodiment in the drawings are denoted by the same reference signs, and description thereof will be omitted.

In the present modification example, a case where a second bent portion is formed in the second conductor portion will be described.

Figure 6:
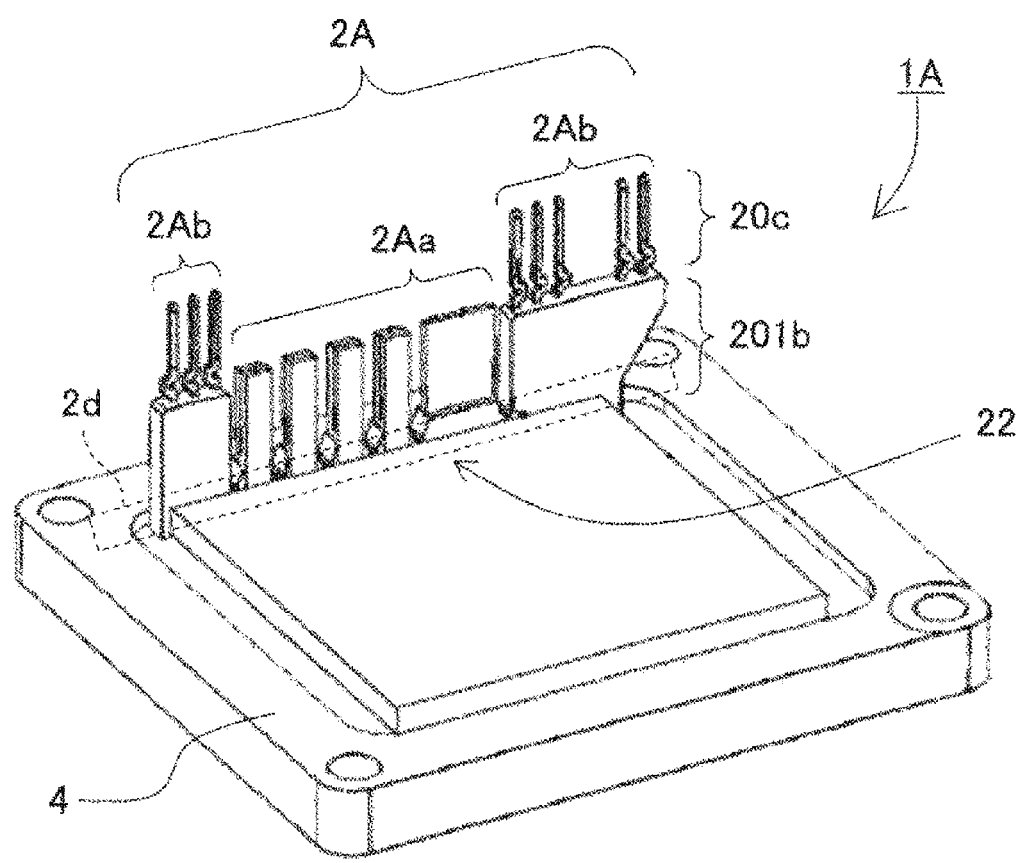
FIG. 6 is a diagram schematically illustrating the appearance of the power semiconductor device according to a modification example of the first embodiment.

FIG. 6 is a diagram schematically illustrating the appearance of a power semiconductor device according to the present modification example.

In FIG. 6, a power semiconductor device LA includes an element installation conductor 2A including a first conductor portion 20a that is made of metal and is used for installing at least one power semiconductor element 300 (see FIG. 2 and the like), a second conductor portion 201b that is made of metal and forms one or more main terminals 2Aa for transmitting a current to the power semiconductor element 300, and one or more control terminals 2Ab for transmitting a switching control signal to the power semiconductor element 300, and a third conductor portion 20c that is made of metal and is provided at a tip portion of the control terminal 2Ab.

Further, the second conductor portion 201b is formed to have a second bent portion 2d that is bent in one direction (upper in FIG. 6) with respect to a direction of protrusion from the sealing resin 22.

Other components are similar to those in the first embodiment.

In the present embodiment configured as described above, it is also possible to obtain the similar effects to those in the first embodiment.

Further, since the main terminal 2Aa and the control terminal 2Ab are bent at a predetermined angle to change the protruding direction, it is possible to realize the connection with the control board even though the power semiconductor device LA is placed flat. In addition, since the second bent portion 2d is provided, it is possible to reduce the linear lengths of the main terminal 2Aa and the control terminal 2Ab, reduce the displacement due to vibration, and improve the vibration resistance.

APPENDIX

Note that, the present invention is not limited to the embodiment described above, and includes various modifications and combinations with other techniques in a range without departing from the gist. Further, the present invention is not limited to the one having all the components described in the above-described embodiment, and includes ones in which some of the components are deleted.

Further, in the present embodiment, the case where the first conductor portion 20a, the second conductor portion 20b, and the third conductor portion 20c are integrated is illustrated and described. For example, the first conductor portion 20a and the second conductor portion 20b may be formed to be separate from each other, and may be electrically connected by wire bonding or the like.

REFERENCE SIGNS LIST 1,1A power semiconductor device
2 element installation conductor
2a,2Aa main terminal
2A element installation conductor
2b,2Ab control terminal
2c bend portion (first bent portion)
2d second bent portion
4 housing
20a first conductor portion
20b second conductor portion
20c third conductor portion
21a frame body
21b heat dissipation fin group
22 sealing resin
31 diode
32 conductor plate
200a tie bar
201a cut surface
201b second conductor portion
300 power semiconductor element

The invention claimed is:

1. A power semiconductor device comprising:
a power semiconductor element; and
an element installation conductor including
a first conductor portion that is made of metal and is used for installing the power semiconductor element,
a second conductor portion that is made of metal and forms one or more main terminals for transmitting a current to the power semiconductor element, and one or more control terminals for transmitting a switching control signal to the power semiconductor element, and a third conductor portion that is made of metal and is provided at a tip portion of the control terminal, wherein the element installation conductor is formed so that a thickness of a thickest portion of the second conductor portion is thinner than a thickness of the first conductor portion, and a thickness of a thickest portion of the third conductor portion is thinner than a thickness of a thinnest portion of the second conductor portion.

2. The power semiconductor device according to claim 1, wherein the third conductor portion has a first bent portion formed to deviate from an extension direction of the third conductor portion.

3. The power semiconductor device according to claim 1, wherein the main terminal is formed by the second conductor portion, and the control terminal is formed by the second conductor portion and the third conductor portion, and a side surface of the second conductor portion of the main terminal is formed to face a side surface of the second conductor portion of the control terminal.

4. The power semiconductor device according to claim 1, wherein sealing resin for sealing the entirety of the first conductor portion and a portion of the second conductor portion is provided, and the main terminal and the control terminal are formed to protrude from the sealing resin in the same direction.

5. The power semiconductor device according to claim 4, wherein the second conductor portion has a second bent portion that is bent in a direction of protrusion from the sealing resin.

6. The power semiconductor device according to claim 1, wherein a cut surface of a tie bar for fixing relative positions of the main terminal and the control terminal is formed on each of opposite portions of side surfaces of the second conductor portion of the main terminal and the second conductor portion of the control terminal.

7. The power semiconductor device according to claim 1, wherein a thickness of the element installation conductor gradually decreases from the first conductor portion to tips of the one or more main terminals and the one or more control terminals.

* * * * *